United States Patent [19]

Yui et al.

[11] Patent Number: 4,945,382

[45] Date of Patent: Jul. 31, 1990

[54] A PRINTER FOR PRINTING A CERTAIN IMAGE ON A SHEET OF DEVELOPING PAPER

[75] Inventors: Yasuji Yui, Saitama; Akio Hitachi, Tokyo; Tatsuru Sato, Chiba; Akira Shirakura, Tokyo, all of Japan

[73] Assignee: Sony Corporation, Tokyo, Japan

[21] Appl. No.: 201,954

[22] Filed: Jun. 3, 1988

[30] Foreign Application Priority Data

Jun. 5, 1987 [JP] Japan .................................. 62-140912

[51] Int. Cl.⁵ .............................................. G03B 27/52
[52] U.S. Cl. ...................................... 355/27; 355/28; 355/68
[58] Field of Search ............................ 355/27, 28, 68; 226/49–51; 250/318, 319; 430/138, 211

[56] References Cited

U.S. PATENT DOCUMENTS

| | | | |
|---|---|---|---|
| 3,458,256 | 7/1969 | Stemke et al. | 355/88 |
| 3,734,617 | 5/1973 | Kitch | 355/111 |
| 3,768,906 | 10/1973 | Michelson et al. | 355/132 |
| 4,149,887 | 4/1979 | Levy | 430/138 |
| 4,648,699 | 3/1987 | Holycross et al. | 355/27 X |
| 4,699,504 | 10/1987 | Kabb et al. | 355/68 X |
| 4,742,374 | 5/1988 | Yamamoto et al. | 355/27 |
| 4,777,513 | 10/1988 | Nelson | 355/27 |
| 4,783,683 | 11/1988 | Nagumo et al. | 355/27 |

FOREIGN PATENT DOCUMENTS 2262845 12/1972 Fed. Rep. of Germany .
1386734 3/1975 United Kingdom .

Primary Examiner—L. T. Hix
Assistant Examiner—D. Rutledge
Attorney, Agent, or Firm—Alvin Sinderbrand

[57] ABSTRACT

In a printing apparatus, a relatively long film having a photosensitive surface composed of photosensitive microcapsules is withdrawn from a supply spool and selectively exposed to light to form a photographed film frame prior to being passed through a nip between urged-together press rollers and then wound onto a take-up spool, sheets of developing paper are delivered one at a time by a paper supply roller from a stack of the sheets for passage between the press rollers with each delivered sheet facing a respective exposed area of the film so as to be pressed together therewith, and a roller drive assembly including a first reversible motor operative in first and second directions in printing and rewinding modes, respectively, a first transmission including a first one-way clutch through which the first motor drives the paper supply roller means only when the first motor operates in the first direction in the printing mode, a second transmission including a second one-way clutch through which the supply spool is rotated in a direction to rewind the film only when the first motor operates in the second direction in the rewinding mode, and a second reversible motor operative in first and second directions for driving the press rollers in corresponding first and second directions in the printing and rewinding modes, respectively.

7 Claims, 7 Drawing Sheets

A PRINTER FOR PRINTING A CERTAIN IMAGE ON A SHEET OF DEVELOPING PAPER

BACKGROUND OF THE INVENTION

1. Field of the Invention

The present invention relates to a printer for printing a predetermined image on a sheet of a developing paper by exposing a sensitive surface comprised of photosensitive microcapsules on a long photosensitive film to a light image according to a predetermined picture signal to form a photographed film frame, and overlapping and pressing together the exposed surface of the photosensitive film with the developing paper sheet while being moved together

2. Description of the Prior Art

Various types of printing systems are known, such as thermal type, pen type, dot type and ink-jet type, for forming on a piece of printing paper a predetermined image, for example, a television image received by a television receiver or a recorded image recorded on a recording medium, such as, a magnetic tape, optical disc or the like. There is a further printing system in which a surface of a photosensitive film provided with photosensitive microcapsules is exposed to the light corresponding to a predetermined image signal to form a photographed film and the exposed film is overlapped with, and pressed against, a sheet of developing paper for printing a corresponding picture on the developing paper.

For example, in the Japanese Patent Laid-open Gazette No. 59-30537, there is disclosed a printing system using a photosensitive film which has provided thereon very small photosensitive microcapsules which are hardened to be non-destructive or uncrushable by pressure when exposed to predetermined wavelength of light and which contain a coloring precursor substance which, when released by crushing of the respective microcapsules, reacts with a developing material provided on a sheet of developing paper to provide a respective color on the latter. The sensitive surface of the photosensitive film is exposed to, for example, ultraviolet light changing in accordance with the decomposed picture elements of a predetermined picture so that a positive photographed film can be produced. The exposed side of the photosensitive film is overlapped with a sheet of developing paper and pressed thereagainst so that the photosensitive microcapsules not exposed to such light are destroyed or crushed to release the coloring precursor substance enclosed therein, which is transferred to the developing paper. Thus, the predetermined picture is printed on the developing paper.

When carrying out the printing of a picture by the system described above, in order to perform the printing operation with high efficiency or to simplify the necessary mechanism as much as possible, it may be considered to use a so-called continuous type photosensitive film, or a roll of photosensitive film wound on a spool and being long enough to form a great number of frames of photographed film.

Moreover, the printer using this long photosensitive film is generally constructed to provide a constant travel path for the photosensitive film, with exposing means being disposed at a location along such travel path, a roller member disposed after the exposing means to pinch and feed the photosensitive film, so that the photosensitive film is made to travel past and be exposed by the exposing means, and developing paper supplying means which supplies a sheet of developing paper into overlapping relation with the exposed portion of the photosensitive film, whereupon the overlapped sheet of developing paper and the exposed film travel in unison while being pressed together by the roller member so as to achieve the desired printing.

In the above printer, however, when the printing of a picture on the developing paper is completed, the trailing end of the photographed film frame of the photosensitive film, or of the exposed portion thereof, will always be substantially spaced from the exposing means. Thus, when the next-picture or photographed film frame is started exposed, there is a waste of a substantial part of the photosensitive film between the trailing end of the last exposed film frame and the position opposing the exposing means.

This waste of part of the photosensitive film aggregates approximately half the whole length of the related photosensitive film, which is very uneconomical.

OBJECTS AND SUMMARY OF THE INVENTION

Accordingly, it is the object of the present invention to provide an improved printer which can obviate the above noted defects encountered with the prior art.

It is another object of the present invention to provide a printer which can use a photosensitive film with little or no waste.

It is a further object of the present invention to provide a printer which can be operated more effectively and economically.

According to an aspect of the present invention, there is provided a printer for printing a desired image on a sheet of developing paper in which a sensitive surface of a long photosensitive film comprised of photosensitive microcapsules is exposed to a light image according to a predetermined picture signal to form a photographed film frame, and the exposed surface of the photosensitive film is overlapped with a sheet of developing paper and pressed thereagainst, the printer comprising:

a supply spool on which the photosensitive film is wound;

a take-up spool on which the photosensitive film withdrawn from said supply spool is wound;

film rewinding means for rotating said supply spool in the film rewinding direction;

exposing means for exposing the photosensitive film to light;

developing paper supplying means for supplying a developing paper sheet;

press rollers for overlapping the photosensitive film and the supplied developing paper sheet and pressing together the overlapped film and paper sheet when being passed together between said rollers; and roller drive means for driving the press rollers to rotate, so that, after the printing of the developing paper sheet, said film rewinding means is driven to rewind the photosensitive film until the leading end of the yet non-exposed portion of the photosensitive film is returned to a position opposite to said exposing means.

The above, and other objects, features and advantages of the present invention, will become apparent from the following detailed description of the preferred embodiment to be taken in conjunction with the accompanying drawings, throughout which like reference numerals designate like elements and parts.

DETAILED DESCRIPTION OF THE PREFERRED EMBODIMENT

An embodiment of a printer according to the present invention will now be described in detail with reference to the accompanying drawings.

The drawings show the application of this invention to a printer 1 for printing images in so-called full color on a developing paper by means of a photosensitive film 4 which has provided on its photosensitive surface which is to be exposed a mixture of a plurality of kinds of coloring precursor carriers included in photosensitive microcapsules of three fundamental colors.

Before proceeding with the explanation of the printer 1, examples of a film cassette in which the photosensitive film to be used in the printer 1 is accommodated and of the developing paper for use in printing will be described below.

Figure 1:
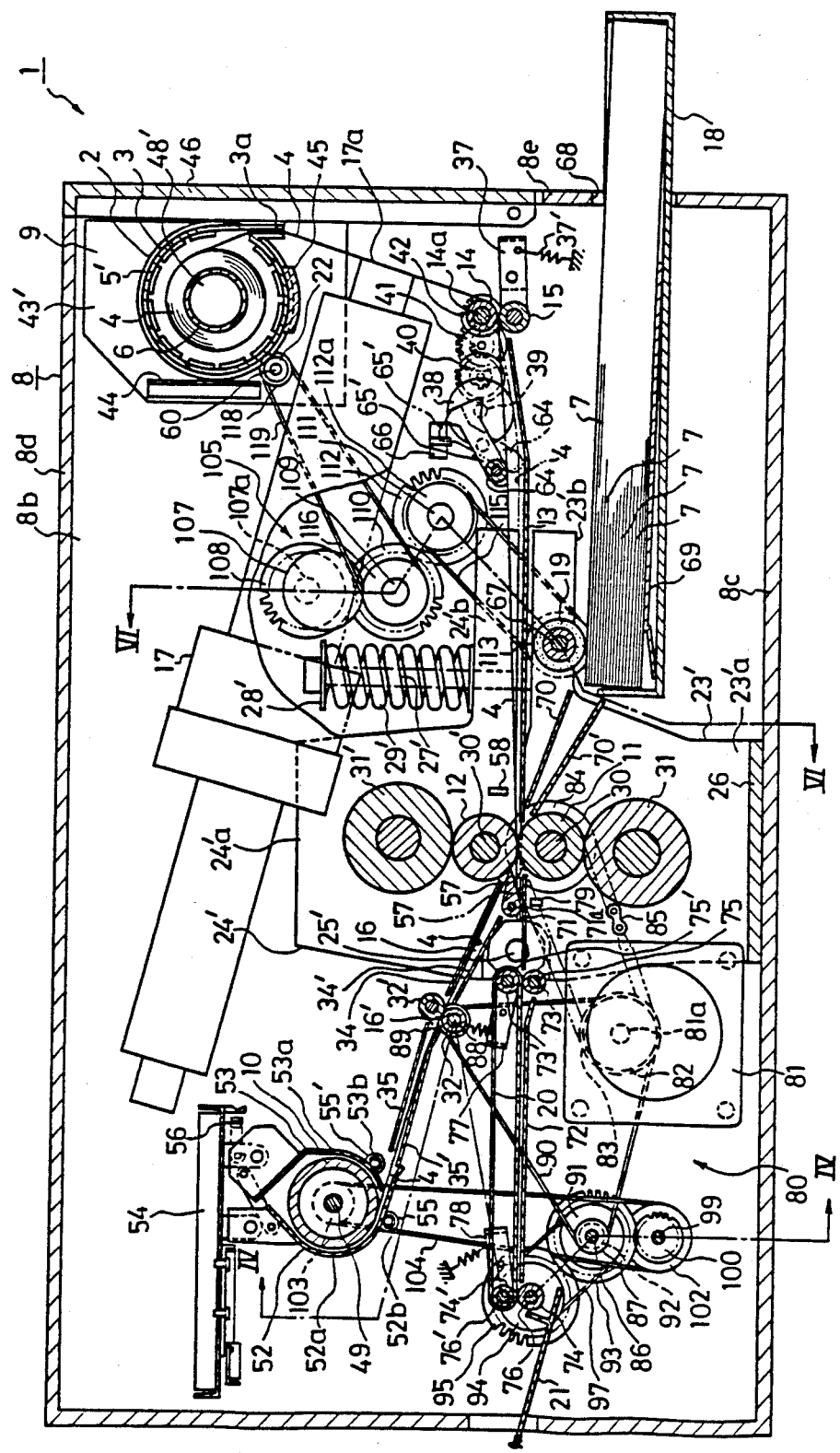
FIG. 1 is a longitudinal cross-sectional view of an embodiment of a printer according to the present invention.
Figure 2:
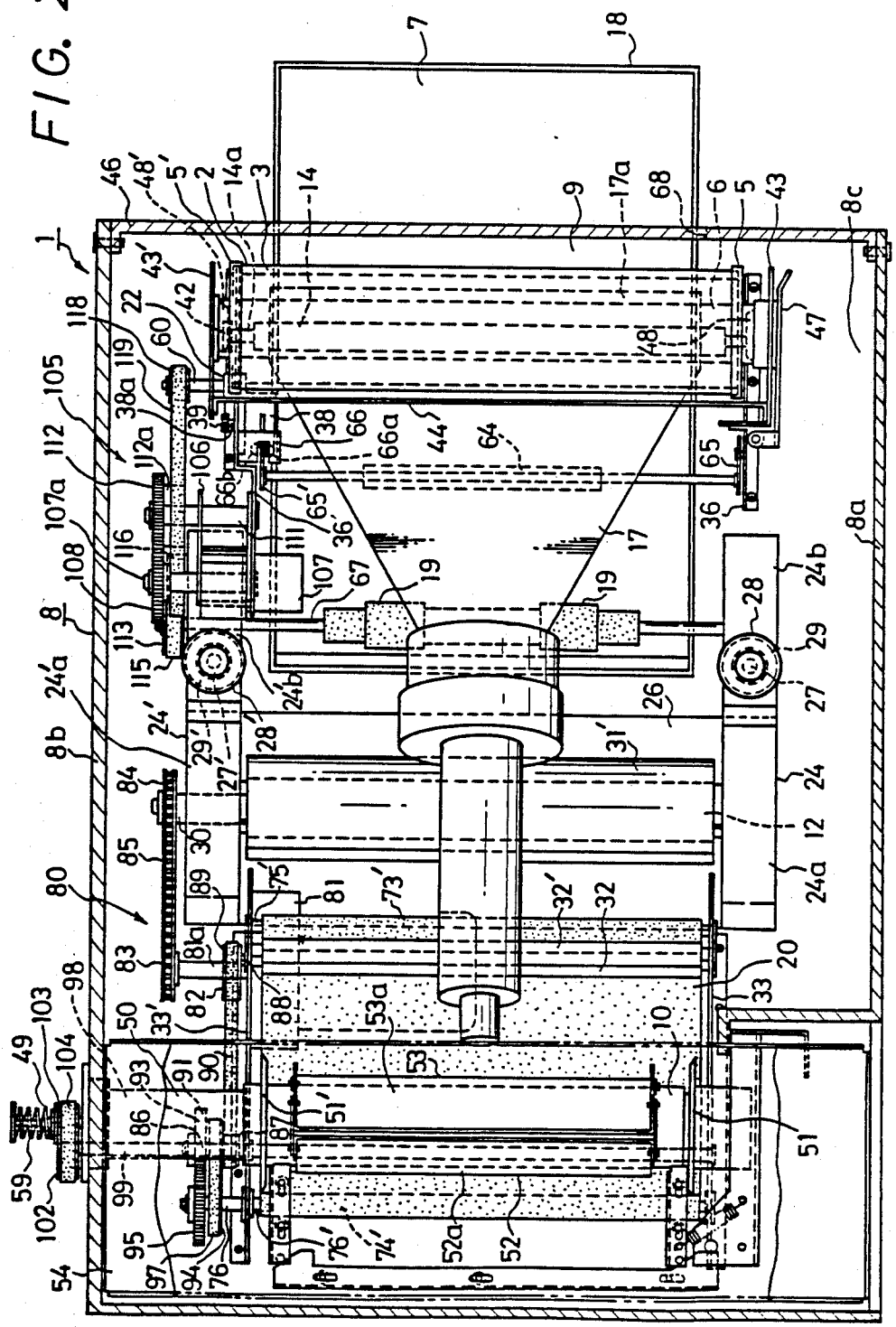
FIG. 2 is a plan view of the printer of FIG. 1 with a part of its outer case cut away.
Figure 3:
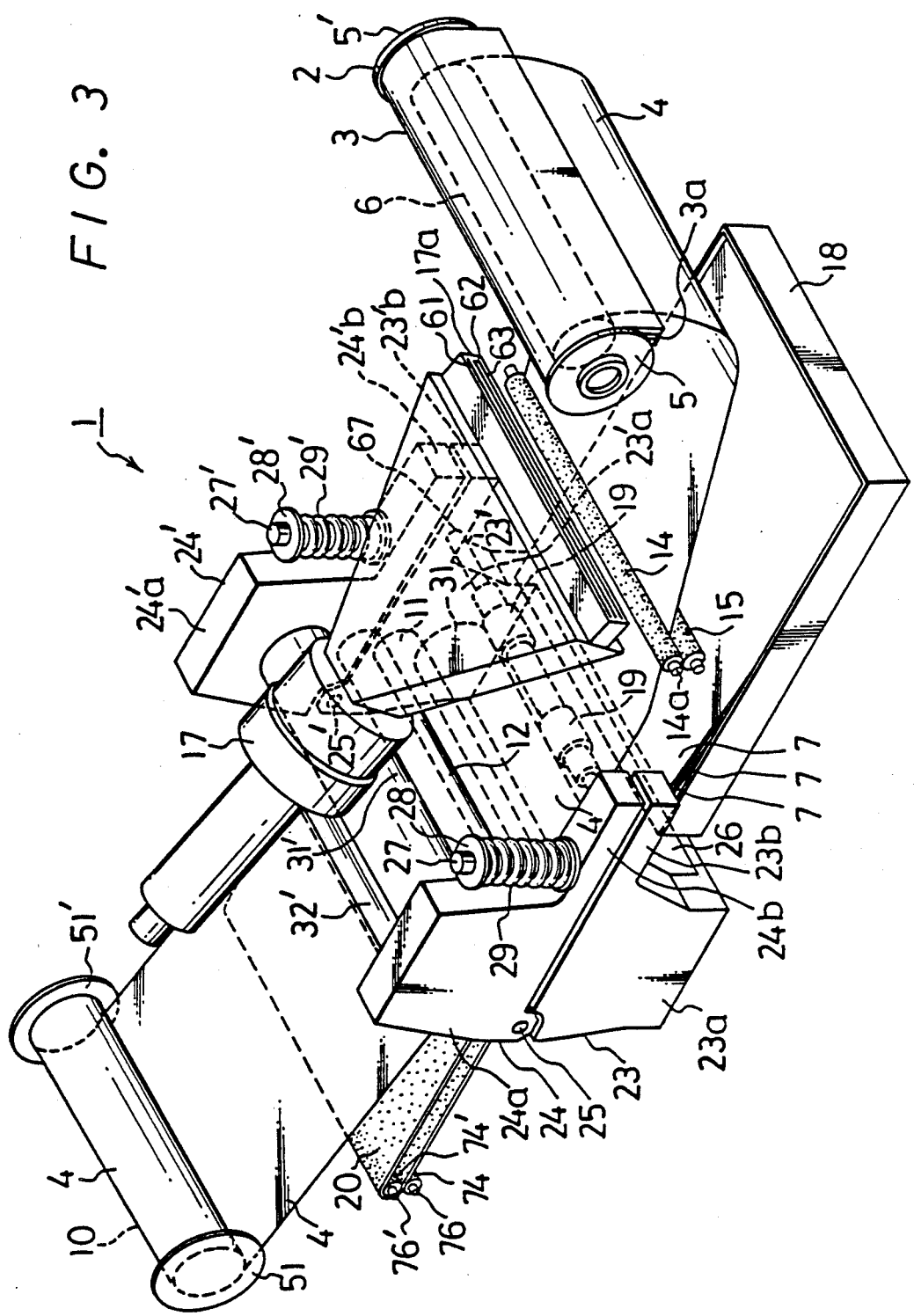
FIG. 3 is a schematic perspective view of major components of the printer of FIGS. 1 and 2.

As shown in FIGS. 1–3 there is provided a film cassette 2 which comprises a cassette case 3 substantially of a cylindrical shape and a supply spool 6 on which a photosensitive film 4 of a long length is wound substantially in the form of a roll. Light shielding flanges 5 and 5' of a slightly larger diameter than the outer diameter of the cassette case 3 are provided at the opposite ends of the spool 6 considered in its axial direction. The supply spool 6 is supported by the cassette case 3 to be rotatable relative to the cassette case with its shielding flanges 5, 5' closing the end openings of the cassette case 3. The leading end of the photosensitive film 4 wound on the supply spool 6 is led out from the case 3 through a film outlet 3a formed in the outer periphery of the cassette case 3.

The photosensitive film 4 is formed of an appropriate film base with photosensitive microcapsules provided on one surface. These photosensitive microcapsules are formed of very small capsules which are changed in their molecular coupling structure and hardened by exposure to, for example, ultraviolet light of a certain wavelength, or otherwise changed by the light so as to be indestructible by pressure, and in which are enclosed predetermined coloring precursors or substances that react with a developing matter provided on a developing paper which will be described later, provide respective coloring. In this case, in each of the capsules there is enclosed one of the coloring precursors of three different colors, for example, one of the coloring precursors respectively exhibiting red, blue and green colors on the developing paper.

In addition, the light-hardening characteristics of these capsules are different depending on the coloring of the coloring precursors contained therein, that is, they are hardened only when irradiated with light rays of respective predetermined wavelengths. Therefore, when light rays of the wavelength which will harden the microcapsules containing the red coloring precursor substance irradiate the microcapsules containing blue or green color precursor substance, the latter are not hardened.

The leading and trailing end portions of the photosensitive film 4 are formed as so-called leader film portions which do not have photosensitive microcapsules thereon. Therefore, all of one surface of the portion of the photosensitive film 4 between the leader film portions is a sensitive surface.

Reference numerals 7, 7, ... represent sheets of developing paper on which pictures are to be printed.

The sheets of developing paper 7, 7, ... are independently formed substantially in a rectangular shape having slightly wider width than that of the photosensitive film 4 and they are each provided on one surface with a predetermined developing substance that reacts with the coloring precursor substances in the photosensitive microcapsules to produce respective predetermined colors on the printing surface of the respective sheet 7.

When this developing paper 7 is overlapped upon the photosensitive film 4 and pressed against that film, the non-hardened capsules of the photosensitive microcapsules provided on the photosensitive film 4 are destroyed or ruptured to release the coloring precursor substance previously enclosed, which is then transferred to the printing surface of the developing paper 7 and reacts with the developing substance so as to produce the respective predetermined coloring.

The general arrangement of the printer 1 will be described next with reference to FIGS. 1 and 2, in which reference numeral 8 represents an outer case of the printer 1. The outer case 8 is box-like and elongated in the left and right directions as viewed in FIGS. 1 and 2. Moreover, in FIG. 2, the downward direction is assumed to face toward the front side of the case 8 and the upward direction faces toward the rear side thereof; and hereinafter, these terms will be used for indicating directions.

There is provided a cassette receiving portion 9 in which the film cassette 2 is detachably mounted. A take-up spool 10 is provided for receiving the photosensitive film 4 withdrawn from the film cassette 2. The take-up spool 10 is shown disposed within the left-hand side portion of the case 8 (FIGS. 1–3).

A pair of press rollers 11 and 12 in rolling contact with each other are provided within the outer case 8 substantially at the center relative to the left-hand and right-hand directions. A film guide plate 13 is shown to have its right end portion positioned under the cassette receiving portion 9 and its left end portion positioned near the entry side of the contact or nip between the press rollers 11 and 12. A pair of film feeding rollers 14 and 15 are positioned near the right-hand end of the film guide plate 13. Film traveling paths 16 and 16' are provided between the exit side of the nip of press rollers 11 and 12 and the take-up spool 10. The photosensitive film 4 withdrawn out of the film cassette 2 set in the cassette receiving portion 9 is made to travel between the film feeding rollers 14 and 15, along the upper surface of the film guide plate 13, between the rollers 11 and 12 and then along the film travel paths 16 and 16' prior to being wound on the take-up spool The printer 1 further comprises a light source 17 that is formed by a great number of optical fiber filaments arranged in a bundle and through which light is transmitted to expose the sensitive surface of the photosensitive film 4 in a pattern according to a predetermined picture signal. This light source 17 is hereinafter simply referred to as an "FOT" (fiber optical tube). The portion of the photosensitive film 4, which is substantially intermediate the cassette receiving portion 9 and the film feeding rollers 14 and 15 is brought in contact with a light emitting surface 17a of the FOT 17 (in FIG. 3, the film cassette 2 is shown somewhat shifted to the right). The photosensitive film 4 is fed a predetermined amount by the film feeding rollers 14, 15 during each exposure of its sensitive surface by the FOT 17, so that a predetermined area or region of the film 4 forms each film frame of a single picture.

A paper supply tray 18 is provided to receive a stock of the developing paper sheets 7, 7,. Each of the developing paper sheets 7, 7, . . . is fed by a paper supply roller 19 at a predetermined timing so that the leading end of such sheet 7, is located at the entry side of the contact between the press rollers 11, 12. Then, the exposed film frame of the photosensitive film 4 is overlapped upon this developing paper sheet 7 and passed between the press rollers 11 and 12 while being pinched therebetween so that the picture projected on the exposed film frame is printed on the developing paper sheet 7.

After the printing has been completed, the printed developing paper sheet 7 is transported by a paper discharge belt 20 to a paper discharge tray 21 (FIG. 1) and substantially at the same time the supply spool 6 is rotated by a drive roller 22 so as to wind the film until the leading margin of the non-exposed portion of the photosensitive film 4 comes in contact with the light-emitting surface 17a of the FOT 17.

Referring now to FIGS. 1-3 and 6, it will be seen that roller supports 23, 23' and 24, 24' respectively support the press rollers 11 and 12. The roller supports 23, 24 and the roller supports 23', 24' substantially of symmetrical structure with each other and are respectively located near a front wall 8a and a rear wall 8b of the case 8 and substantially at the center of the case 8, considered in the left-hand and right-hand directions.

Reference numerals 23a, 23'a and 24a, 24'a denote main portions of lower supports 23, 23' and upper roller supports 24, 24', respectively. The main portions 23a, 23'a and 24a, 24'a are relatively thick plates of a trapezoidal shape are substantially symmetrical in the vertical direction as viewed from the front and rear sides. Moreover, the upper ends of the main portions 23a and 23'a of the lower roller supports 23, 23' and the lower ends of the main portions 24, 24' of the upper roller supports 24, 24' are projected substantially horizontally toward the right to form arms 23b, 23'b, and 24b, 24'b. The upper left corners of the main portions 23a, 23'a of the lower roller supports 23, 23' and the lower left corners of the main portions 24a, 24'a of the upper roller supports 24, 24' are rotatably coupled by pivot pins 25 and 25'. The lower ends of the main portions 23a, 23'a of the lower roller supports 23, 23' are connected to a base 26, and this base 26 is fixed to a bottom plate 8c of the case 8.

Spring receiving shafts 27, 27' are projected upward from the arms 23b, 23'b of the lower roller supports 23, 23'. The spring receiving shafts 27, 27' extend through apertures, not shown, which are bored in the arms 24b, 24'b of the upper roller supports 24, 24' with the major parts of the shafts 27, 27' projecting above the arms 24b, 24'b. At the upper ends of the spring receiving shafts 27, 27' are fixed spring receiving heads 28, 28' and compressed coil springs 29, 29' are fitted around the spring receiving shafts 27, 27' between the heads 28, 29' and the arms 24b, 24'b of the upper roller supports 24, 24'.

Therefore, the upper roller supports 24, 24' are always urged to rotate in the clockwise direction in FIG. 1.

The press rollers 11 and 12 are slightly wider than the width of the photosensitive film 4 and are made of a metal or a material with substantially the same hardness as metal. The front and rear ends of a shaft 30 of the lower press roller 11 are rotatably supported by the main portions 23a and 23'a of the lower roller supports 23 and 23' substantially at the middle of their upper portions relative to their left-hand and right-hand directions. The front and rear ends of a shaft 30' of the upper press roller 12 are similarly rotatably supported by the main portions 24a and 24'a of the upper roller supports 24 and 24' at the middle of their lower portions opposite to the positions where the ends of the shaft 30 are supported.

Since the upper roller supports 24, 24' are urged to rotate in the clockwise direction by the springs 29, 29', the upper press roller 12 supported by the roller supports 24, 24' is also urged downwardly, that is, in the clockwise direction in FIG. 1 about the pivot pins 25, 25'. Therefore, the rollers 11 and 12 are pressed against each other by the resilient force of the compressed coil springs 29, 29'.

Back-up rollers 31 and 31' are rotatably supported by the lower roller supports 23, 23' and the upper roller supports 24, 24', respectively. These back-up rollers 31, 31' are somewhat larger in their diameter than the press rollers 11, 12. The lower back-up roller 31 contacts the lower press roller 11 from below for pressing it upward, while the upper back-up roller 31' contacts the upper press roller 12 from above for pressing it downward. Thus, the press rollers 11 and 12 are pressed against each other by a substantially uniform pressing force along their entire lengths in the axial directions.

The lower press roller 11 is the driving press roller. More specifically, the press roller 11 is rotated in the counterclockwise direction as viewed in FIG. 1 when the photosensitive film 4 is being exposed to light (hereinafter, this state is referred to as the "exposing mode") and when the image is being printed on the developing paper 7 (hereinafter, this state is referred to as the "printing mode"). On the other hand, when the photosensitive film 4 is being rewound (hereinafter, this state is referred to as the "film rewinding mode"), this roller 11 is rotated in the clockwise direction as viewed on FIG. 1.

As shown in FIG. 1, the film guide plate 13 is supported by the lower roller supports 23, 23' in such a fashion that substantially ⅓ of the entire length of the film guide plate, as measured from the extreme right-hand end thereof, gradually slopes upward as it goes to the right, with the remainder of the plate 13 being extended in substantially the horizontal direction.

Travel assisting rollers 32 and 32' are provided at about the mid position between the exit from the nip of the press rollers 11, 12 and the take-up spool 10. These travel assisting rollers 32 and 32' extend between support chassis 33 and 33' which are directed upwardly from the bottom plate 8c, and which are respectively located to the left of the roller supports 23, 24 and roller supports 23', 24'. The roller 32 is rotatably supported, at its ends, in the support chassis 33, 33', as shown on FIGS. 2 and 4.

The upper travel assisting roller 32' is supported by roller support arms (not shown) which are pivoted on the support chassis 33, 33', and urged downwardly so that the upper roller 32' is pressed against the lower travel assisting roller 32 at all times.

The lower travel assisting roller 32 is a driving roller. More specifically, the travel assisting roller 32 is rotated in the counter-clockwise direction as viewed in FIG. 11 in the exposing mode and in the printing mode and is rotated in the clockwise direction in the film rewinding mode.

Guide plates 34, 34' and 35, 35' are supported by the support chassis 33 and 33' and are located between the exit side of the nip of the press rollers 11, 12 and the entry side of the nip of the travel assisting rollers 32, 32', and between the exit side of the nip of the travel assisting rollers 32, 32' and the take-up spool 10, respectively. The guide plates 34 and 34' form a flat space therebetween which serves as the film traveling path 16 and the guide plates 35 and 35' form a flat space therebetween which serves as the film traveling path 16'.

The film feed rollers 14, 15 act to advance the photosensitive film 4 a predetermined distance during each operation in the exposing mode. The upper film feed roller 14 is rotatably supported between support chassis 36 and 36' which are respectively located to the right side of the roller supports 23, 24 and the roller supports 23', 24', respectively, within the outer case 8. Meanwhile, the lower film feed roller 15 is rotatably supported between the support chassis 36 and 36' by roller support arms 37 (FIG. 1) that are urged by springs 37' in the clockwise direction as viewed in FIG. 1 so that the lower roller 15 is pressed against the upper feed roller 14.

A stepping motor 38 (FIG. 1) is fixed to the left end of the rear support chassis 36'. A gear 39 connected to the rotating shaft 38a of the stepping motor 38 is meshed with a gear 42 fixed to the rear end of the shaft 14a of the upper film feed roller 14 through reduction gears 40 and 41 (which are shown only in FIG. 1). Thus, when the stepping motor 38 rotates, the film feed roller 14 is rotated at a very slow rate in the clockwise direction in FIG. 1.

The cassette receiving section 9 is formed by portioning plates 43 and 43' provided separately at the upper-right front and rear corners within the outer case 8, an inner plate 44 connected between the partitioning plates 43 and 43', and arcuate bottom plate 45 connected between the lower ends of the partitioning plates 43 and 43', and a door 46 constituting an upper part of the right side wall 8e. Moreover, a detaching operation plate 47 is pivotally supported by the front partitioning plate 43, and spool support projections or bosses 48 and 48' (see FIG. 2) extend toward each other from the detaching operation plate 47 and the rear partitioning plate 43'.

The film cassette 2 is loaded in the cassette receiving section 9 in such a fashion that the film exit 3a of the cassette case 3 is oriented downward, that the cassette case 3 is held by the inner plate 44 and the bottom plate 45 and that the opposite ends of the spool 6 receive and are rotatably supported by the spool support or projections or bosses 48, 48'.

The take-up spool 10 is fixed on a spool shaft 49 which is rotatably supported by a bearing housing 50 fixed to the back wall 8b of the outer case 8 at its left end portion.

Flanges 51 and 51' are provided at the opposite ends of the take-up spool 10.

Spool covers 52 and 53 are provided to cover the take-up spool 10. The spool covers 52 and 53 have trough-like main portions 52a and 53a of about the same length as the take-up spool 10, and their front- and rear-ends are supported by an upper chassis 54 which is provided near the top plate 8d of the outer case 8. Also, the main portions 52a and 53a respectively surround substantially the left and right halves of the outer periphery of the take-up spool 10 with a slight spacing therebetween.

Moreover, the main portions 52a, 53a have roller support recesses 52b, 53b formed at several positions in their peripheral portions or near those portions (in the drawings only one recess is shown in each main portion). By these roller support recesses 52b, 53b are rotatably supported film pressing rollers 55, 55'.

The spool covers 52, 53 are angularly urged by an elastic member 56 (see FIG. 1) so that their main portions 52a, 53a are made to contact the outer periphery of the take-up spool 10. Thus, the film pressing rollers 55, 55' are brought into resilient contact with the outer periphery of the take-up spool 10.

The end edge of the main portion 52a of the left pool cover 52 is extended so that it comes in contact with the under side of the left end of the guide plate 35'. Therefore, the film travel path 16' is communicated with the space formed between the take-up spool 10 and the spool covers 52, 53.

As shown on FIG. 1, a separating flap 57 is formed with a slender plate shape and is elongated in the front-to rear-direction and is substantially of a wedge-like cross-sectional shape with its sharp edge directed toward the right, as viewed on FIG. 1. This separating flap 57 is located near the exit side of the press rollers 11, 12 and is pivotally movable between a separating position in which its sharp edge contacts with the outer periphery of the upper roller 12 at a point slightly upward from its lowest point, as indicated by the solid line in FIG. 1, and a guide position in which its sharp edge contacts with the outer periphery of the lower press roller 11 at a point slightly downward from its highest point as indicated by the two-dot chain line in FIG. 1.

The separating flap 57 is retained in the above-mentioned guide position only when the photosensitive film 4 is being loaded and it is kept in the above-mentioned separating position at all other times.

The photosensitive film 4 is loaded as follows.

First, the film cassette 2 is loaded in the cassette receiving section 9 and the photosensitive film 4 is withdrawn out of the cassette case 3 by a proper amount. Then, the leading end of its leader film portion is inserted between the film feeding rollers 14 and 15. When the photosensitive film 4 is ordered to be loaded, the separating flap 57 is moved to the guide position, the film feed roller 14 is rotated in the clockwise direction as viewed in FIG. 1, and the press roller 11 is rotated in the counter-clockwise direction. Further, at such time, the travel assisting roller 32 is rotated in the counter-clockwise direction and the take-up spool 10 is rotated in the clockwise direction, as viewed in FIG. 1.

When the photosensitive film 4 is being loaded, the stepping motor 38 is rotated to drive the film feed rollers 14 and 15 at substantially the same rotational rate as the press rollers 11 and 12.

Thus, the photosensitive film 4 is moved first by the film feed rollers 14 and 15, and after passing between the film rollers 14 and 15 is further moved along the upper surface of the film guide plate 13 and into the nip between the press rollers 11 and 12. When the leading end of the film 4 enters between the press rollers 11 and 12, the film 4 is moved by the press rollers 11 and 12. As the leading end of the film 4 exits from the nip between the press rollers 11 and 12, it is guided by the separating flap 57 into the space between the guide plates 34 and 34', and passed through the film travel paths 16 and 16'. The travel assisting rollers 32, 32' ensure that the movement of the film 4 will not slacken within the film travel paths 16 and 16'. Then, the film 4 enters into the space between the take-up spool 10 and the spool covers 52 and 53 and is wound on the take-up spool 10 by the film pressing rollers 55, 55'.

A film sensor 58 (FIG. 1) is provided above the film guide plate 13 at a location close to the press rollers 11 and 12.

The photosensitive film 4 has elements thereon detectable by the film sensor 58, and which are provided along one side edge of the film 4 at a constant pitch or spacing slightly longer than the length of the developing paper sheets 7. The loading operation of the photosensitive film 4 is stopped when the first such element is detected by the sensor 58, at which time, the leading end of the leader film portion of the photosensitive film 4 is wound on the take-up spool 10, and at least the starting end of the sensitive surface of the film 4 reaches the position at which it comes in contact with the light emitting surface 17a of the FOT 17.

A torque limiter 59 (FIGS. 2 and 4) is interposed between the spool shaft 49 of the take-up spool 10 and the drive member to be described later. The take-up spool 10 is subjected to a torque so as to take up the photosensitive film 4 at a speed faster than the film travel speed determined by the press rollers 11, 12. After the photosensitive film 4 has been wound around the spool 10, the torque limiter 59 slips relative to the drive member so that the photosensitive film 4 can be wound on the spool 10 without slack.

As shown on FIGS. 1 and 2, a roller shaft 60 is rotatably supported by the back partitioning plate 43' of the cassette receiving section 9. The portion of the roller shaft 60 projecting forwardly from the partitioning plate 43' is secured to a rewinding roller 22. When the film cassette 2 is placed in the cassette receiving section 9, the rewinding roller 22 is brought into rolling contact with the outer peripheral surface of the flange 5' of the supply spool 6.

The rewinding roller 22 is driven by a drive member, as will be described later, only in the film rewinding mode, to rotate in the clockwise direction in FIG. 1, causing the supply spool 6 to rotate in the film rewinding direction, or in the counter-clockwise direction as viewed in FIG. 1. In other modes, the rewinding roller 22 is rotated in the counter-clockwise direction by the rotating supply spool 6.

The FOT is the light source for exciting the sensitive surface of the photosensitive film 4 as described above. This light source 17 emits light rays, for example, ultraviolet rays of three different wavelengths, for hardening the corresponding three different kinds of photosensitive microcapsules provided on the sensitive surface. The light rays of three different Wavelengths are respectively emitted at three laterally extending light emitting lines 61, 62 and 63 which are vertically arranged in the light emitting surface 17a (see FIG. 3), and they correspond to the decomposed three different fundamental color patterns of the picture elements along one lateral scan or line of a predetermined color picture.

When the exposure operation is started, the stepping motor 38 is rotated intermittently in synchronism with the timing of the light emission from the FOT 17, and this causes the film feed rollers 14 and 15 to rotate intermittently with a constant pitch. As a result, the photosensitive film 4 is moved intermittently by an incremental or constant amount during each movement, in the forward direction, so as to be drawn out of the supply spool 6 and to move in the direction toward the take-up spool 10. After the photosensitive film 4 is loaded, the photosensitive surface thereof comes to oppose the face 17a of the FOT 17 and is exposed along lines facing the light emitting lines 61, 62 and 63 extending across the width of the sensitive surface.

As the photosensitive film 4 is advanced intermittently by the rollers 14 and 15 and is exposed step by step, the photosensitive film 4 becomes slack between the film feed rollers 14, 15 and the press rollers 11, 12. When the slack of the photosensitive film 4 increases to a certain amount, it is detected by a hereinafter described slack sensor, with the result that the press rollers 11, 12 rotate to remove the slack from the film 4.

The photosensitive film 4, when exposed to light, provides a photographed film frame corresponding to a predetermined picture. When one photographed film frame is completely produced, the leading end of the photographed film frame reaches the position near the entry side of the nip between the press rollers 11 and 12. Substantially at the same time or immediately thereafter, one of the elements to be detected on the photosensitive film 4 is detected by the film sensor 58 so that the stepping motor 38 stops its intermittent rotation.

As shown on FIGS. 11 and 2, a tension roller 64 is provided above the film guide plate 13 at a location slightly to the right from the mid point between the left and right ends of the film guide plate 13.

Roller support arms 65 and 65' are pivotally supported by the support chassis 36, 36'. The above-mentioned tension roller 64 is rotatably supported between the left-hand ends of the roller support arms 65 and 65'. The roller support arms 65 and 65' are urged to pivot in the counter-clockwise direction as viewed in FIG. 1 by elastic means (not shown).

Therefore, the tension roller 64 is elastically moved substantially downward to yieldably urge the photosensitive film 4 downward.

A slack sensor 66 is supported by the chassis 36' and has a light emitting element 66a and a light receiving element 66b arranged in opposing relation with the right-hand end of the roller support arm 65' being movable between the elements 66a and 66b.

This slack sensor 66 generates a signal for causing the press roller 11 to rotate when the right end of the roller support arm 65' is interposed between the light emitting element 66a and the light receiving element 66b so as to block the path of the light from the light emitting element 66a to the light receiving element 66b.

When the loading of the photosensitive film 4 is completed, the photosensitive film 4 is tightened with a certain tension between the film feed rollers 14, 15 and the press rollers 11, 12 as indicated by the solid line in FIG. 1 and thus the tension roller 64 is pushed upward by the film 4 to rest thereon in the position indicated by the solid line in FIG. 1. In this condition, the right end portion of the roller support arm 65' is out of the light path in the slack sensor 66.

As the exposing operation proceeds, the photosensitive film 4 is moved forward by the film feed rollers 14, 15 and thus the photosensitive film 4 becomes increasingly slack between the film feed rollers 14, 15 and the press rollers 11, 12. With the increase of the slack, the tension roller 64 and the roller support arms 65, 65' are moved in the counter-clockwise direction by the pivotal force exerted upon the roller support arms 65, 65'. When the slack in the photosensitive film 4 grows to an extent such that the film 4 becomes close to the film guide plate 13, the right-hand end portion of the roller support arm 65' blocks the path of the light between the light emitting element 66a and the light receiving element 66b of the slack sensor 66 as indicated by the two-dot chain line in FIG. 1, thus the sensor 66 generates the signal for initiating the rotation of the press roller 11.

Then, the press roller 11 is rotated in the counter-clockwise direction to advance the slack part of the photosensitive film 4 that lies ahead of the film rollers 14, 15, for thereby removing the slack. When the slack is removed, the tension roller 64 is moved upward to cause the right-hand end portion of the roller support arm 65' to move out of the light path in the slack sensor 66, and thus the press roller 11 is stopped from rotating.

During the successive exposures of the photosensitive film 4, the operation for removing the slack is repeated.

In FIGS. 1 to 3, reference numeral 67 designates the shaft of the paper supply roller 19. The shaft 67 is rotatably supported at its ends between the arms 23b and 23'b of the lower roller supports 23 and 23'. When each developing paper sheet 7, 7, . . . is fed (hereinafter, referred to as "paper supply mode"), the roller 19 is rotated in the clockwise direction, as viewed in FIG. 1.

The paper supply tray 18 is inserted into the outer case 8 through a tray insertion opening 68 that is formed at the lower portion of the right-hand side wall 8e of the case 8. When the paper supply tray 18 is inserted to a predetermined tray position, the left end of the tray 18 comes just below the paper supply roller 19 and the left end portion of a lifting plate 69 is sprung up by elastic means not shown, for pushing the stacked developing paper sheets 7, 7, . . . upward. As a result, the leading end of the top one of the stacked sheets 7, 7 of developing paper . . . placed on the lifting plate 69 is pressed against the paper supply or feed roller 19.

Upper and lower guides 70 and 70' are disposed in opposing relation to each other in such a manner that the distance therebetween narrows toward the left. The right-hand ends of the guides 70, 70' are close to the inner end of the upper surface of the paper supply tray 18, and their left-hand ends are close to the entry side of the nip between the press rollers 11, 12.

When the exposure to one light image is completed, the film sensor 58 generates a predetermined signal, causing the paper supply or feed roller 19 to be rotated in the clockwise direction so that the top one of the sheets 7 of developing paper is fed by the paper supply roller 19. Then, this paper sheet 7 is guided by the paper guides 70, 70' so that its leading end portion is inserted between the photosensitive film 4 and the lower press roller 11.

When the press roller 11 is then rotated in the counter-clockwise direction, the thus fed developing paper sheet 7 is overlapped with the photographed film frame of the photosensitive film 4 and transported together therewith between the press rollers 11 and 12 so that the picture is printed on the developing paper sheet 7.

A first paper discharge guide plate 71 extends from the exit side of the nip between the press rollers 11, 12 to the paper discharge belt 20 at a level just under the separating flap 57. As earlier noted, the separating flap 57 is in its separating position except when the photosensitive film 4 is being loaded. Therefore, with the flap 57 in its separating position, the flap 57 and the first paper discharge guide plate 71 are combined to form a space therebetween for guiding the developing paper sheet 7 that emerges from between the press rollers 11 and 12.

A second paper discharge guide plate 72 is disposed under the paper discharge belt 20 with its right end spaced by a slight distance from the left end portion of the first paper discharge guide plate 71 and its left end lying above the root portion of the paper discharge tray 21 which slopes slightly down to the right.

As shown on FIGS. 1 to 3, paper discharge rollers 73, 73' and 74, 74' are associated with the paper discharge belt 20. The right-hand paper discharge rollers 73, 73' are arranged one over the other with their line of contact close to the left end of the first paper discharge guide plate 71. The left-hand paper discharge rollers 74, 74' are also arranged one over the other with their line of contact close to the left end of the second paper discharge guide plate 72.

The lower rollers 73, 74 have shafts 75 and 76 rotatably supported between the support chassis 33 and 33', and the upper rollers 73' and 74' have shafts 75' an 76' rotatably supported between the pivotal end portions of roller support arms 77 and 78 that are rotatably supported by the support chassis 33 and 33'. Further, the upper paper discharge rollers 73' and 74' are urged downwardly by springs acting on the roller support arms 77 and 78 and are thereby pressed against the lower paper discharge rollers 73, 74.

The paper discharge belt 20 is extended endlessly around the upper paper discharge roller 73' and 74'. Therefore, the left and right ends of the lower run of the paper discharge belt 20 are brought in contact with the lower paper discharge rollers 73, 74 and the lower surface of the belt 20 comes in light contact with the upper surface of the second paper discharge guide plate 72.

The lower discharge roller 74 is rotated in the counter-clockwise direction in FIG.1 by a drive member which will be described later. When this paper discharge roller 74 is rotated in the counter-clockwise direction, the lower run of the paper discharge belt 20, facing the second paper discharge guide plate 72 is moved from the right to the left, and the lower paper discharge roller 73 is rotated in the counter-clockwise direction.

As shown on FIG. 1, a printing completion sensor 79 is provided for detecting the rear end of a developing paper sheet 7 emerging from between the press rollers 11 and 12, that is, for detecting that the entire developing paper sheet 7 has completely exited from between the press rollers 11 and 12. The printing completion sensor 79 is disposed under the first paper discharge guide plate 71 at a position close to a hole 71a bored in this plate.

When the printing operation is started, the paper discharge roller 74 is rotated in the counter-clockwise direction, and a developing paper sheet 7 and the photosensitive film 4 tightly adhered to each other exit from between the press rollers 11 and 12 while being pressed therebetween. In this case, the leading edge of the sheet 7 overlapping the photosensitive film 4 is separated from the latter by the sharp edge of the separating flap 57. The thus separated developing paper sheet 7 is guided to pass between the flap 57 and the first paper discharge guide plate 71 and is then pulled through the entry side of the line of contact between the paper discharge belt 20 and the lower paper discharge roller 73 into the space between the paper discharge belt 20 and the second paper discharge guide plate 72. this developing paper sheet 7 is further transported by the paper discharge belt 20 and discharged at the exit side of the line of contact between the paper discharge belt 20 and the paper discharge roller 74 into the paper discharge tray 21.

When the rear or trailing end of the developing paper sheet 7 passes over the printing completion sensor 79, the printing completion sensor 79 generates a predetermined signal, in response to which rewinding of the photosensitive film 4 is commenced.

As shown in FIGS. 1, 2, 4 and 5, a drive assembly 80 is provided for driving the print and paper discharge system, that is, for driving the press roller 11, take-up spool 10, travel assisting roller 32 and paper discharge roller 74. This drive assembly 80 causes the photosensitive film 4 to travel and be wound on the take-up spool 10, the developing paper sheet 7 to be subjected to the printing and the printed paper sheet 7 to be discharged. The solid arrows in FIG. 5 indicate the transport direction or rotation direction during printing and the broken arrows indicate the same during rewinding of film.

The drive assembly 80 is shown to include a motor 81 with a decelerator. This motor 81, which is, hereinafter, referred to as "printing motor", is fixed to the right front end portion of the support chassis 33'. The rotating shaft 81a of the motor 81 projected backward from the support chassis 33' has a sprocket wheel 82 fixed on its front end portion and similarly a chain gear 83 fixed to its back end portion.

The shaft 81a of the printing motor 81 rotates in the counter-clockwise direction as viewed in FIG. 1 during printing but in the clockwise direction upon rewinding of the film 4.

A chain gear 84 is fixed to the back end portion of the shaft 30 of the lower press roller 11 which extends rearward from the roller support 23'. An endless chain 85 is extended around the gear 84 and the chain gear 83 fixed to the rotating shaft 81a of the printing motor 81.

When the printing motor 81 is driven, the press roller 11 is rotated in the same direction as the printing motor 81.

Therefore, the press roller 11 is rotated in the counter-clockwise direction in the printing mode and in the clockwise direction in the film rewinding mode.

There is further provided a first transmission shaft 86 which is rotatably supported between the support chassis 33 and 33'. As shown particularly on FIGS. 4 and 5, a sprocket wheel 87 is secured to the front portion of an extension of the shaft 86 projected backward from the support chassis 33'.

Reference numeral 88 represents the shaft of the lower travel assisting roller 32. A sprocket wheel 89 is fixed to a portion of the shaft 88 projected rearward from the support chassis 33'.

An endless timing belt 90 is extended around the sprocket wheel 89, the sprocket wheel 87 fixed to the first transmission shaft 86 and the sprocket wheel 82 fixed to the rotating shaft 81a of the printing motor 81.

Figure 5:
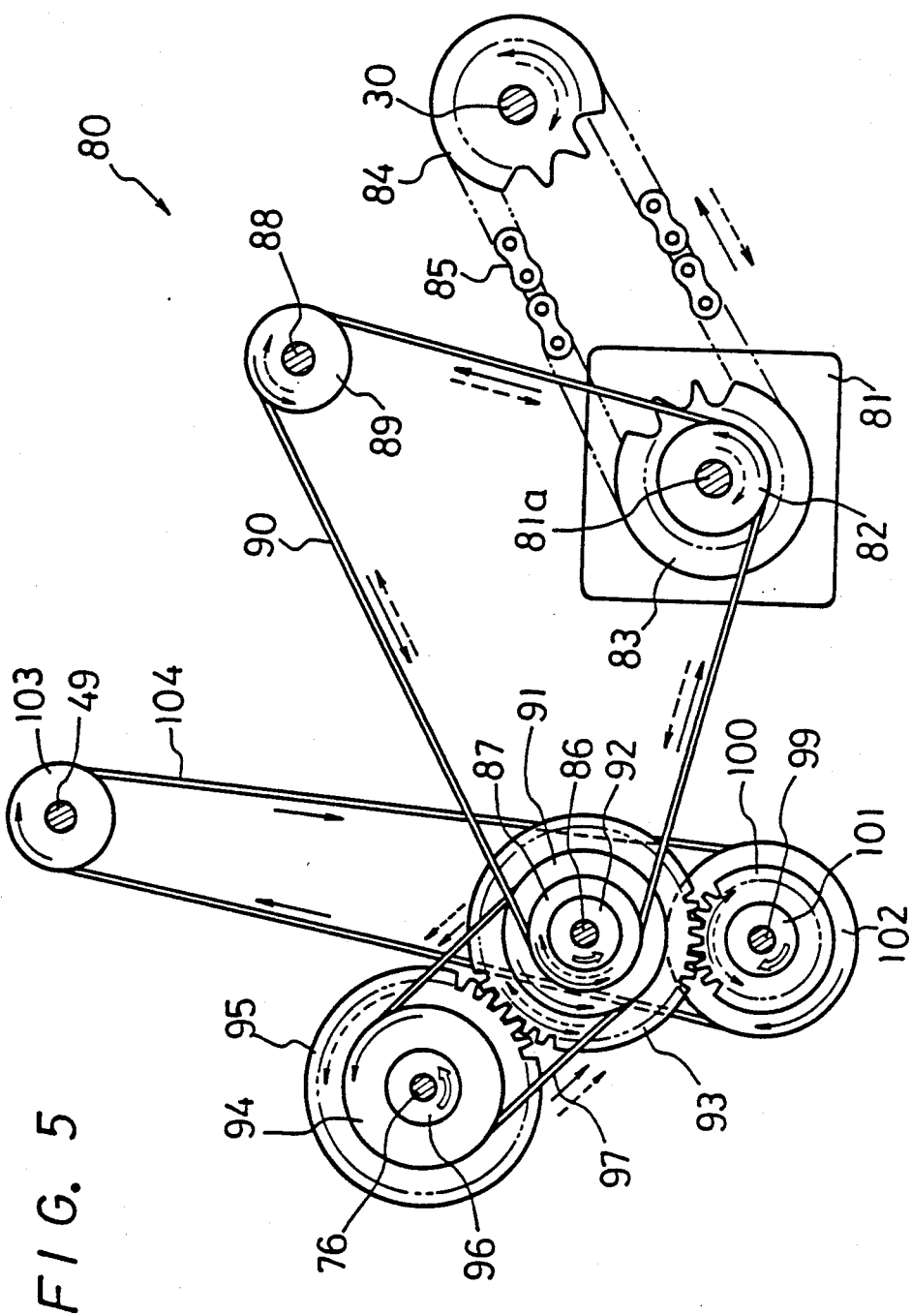
FIG. 5 is a schematic, enlarged view of a driving mechanism included in the printing and paper discharging system.

Therefore, in the printing mode, the counter-clockwise rotation of the printing motor 81 causes the endless timinq belt 90 to travel in the solid-arrow direction shown in FIG. 5. Consequently, the first transmission shaft 86 and the travel assisting roller 32 are rotated in the counter-clockwise direction. In the film rewinding mode, the printing motor 81 is rotated in the clockwise direction, causing the endless timing belt 90 to travel in the broken arrow direction shown in FIG. 5. Thus, the first transmission shaft 86 and the travel assisting roller 32 are rotated in the clockwise direction.

A sprocket wheel 91 is located in back of the sprocket wheel 87 and is coupled through a one-way clutch 92 to the first transmission shaft 86. A first transmission gear 93 is located in back of the sprocket wheel 91 and is secured to the first transmission shaft 86. The one-way clutch 92 is constructed to couple the first transmission shaft 86 to the sprocket wheel 91 only when the first transmission shaft 86 tend to rotate counter-clockwise relative to the sprocket wheel 91.

A sprocket wheel 94 is secured to an extension of the shaft 76 of the paper discharge roller 74 extending rearward from the support chassis 33'. A second transmission gear 95 is located in back of the sprocket wheel 94 and is coupled through a one-way clutch 96 to the shaft 76. An endless timing belt 97 is extended around the sprocket wheel 94 and the sprocket wheel 91 on the first transmission shaft 86, and the second transmission gear 95 is meshed with the first transmission gear 93.

The one-way clutch 96 is constructed to couple the shaft 76 to the second transmission gear 95 only when the second transmission gear 95 tends to rotate counter-clockwise relative to the shaft 76 of the paper discharge roller 74 in FIG. 5.

Thus, since in the printing mode the first transmission shaft 86 is rotated in the counter-clockwise direction, as described above, the first transmission shaft 86 and the sprocket wheel 91 are coupled through the one-way clutch 92 and consequently the endless timing belt 97 is moved in the solid-arrow direction shown in FIG. 5 so that the paper discharge roller 74 is rotated in the counter-clockwise direction shown in FIG. 1.

At this time, the first transmission gear 93 is rotated with the shaft 86 in the counter-clockwise direction, causing the second transmission gear 95 to rotate in the clockwise direction. When the second transmission gear 95 is rotated in this direction, the one way clutch 96 is not interlocked therewith, so that during printing the second transmission gear 95 does not interfere with rotation of the shaft 76 of the paper discharge roller 74.

Further, since the first transmission shaft 86 is rotated in the clockwise direction in the film rewinding mode, as previously described, the first transmission gear 93 is rotated with the shaft 86 in the clockwise direction, thereby causing the second transmission gear 95 to rotate in the counter-clockwise direction. In this condition, the second transmission gear 95 and the shaft 76 of the paper discharge roller 74 are connected through the one-way clutch 96 and thus the paper discharge roller 74 is rotated in the counter-clockwise direction.

At this time, the sprocket wheel 94 fixed to the shaft 76 of the paper discharge roller 74 is also rotated in the counter-clockwise direction, causing the larger sprocket wheel 91 provided on the first transmission shaft 86 to be rotated in the counter-clockwise direction as a result of transmitting this rotation through the endless timing belt 97 to the sprocket wheel 91. Since the sprocket wheel 91 is coupled to the first transmission shaft 86, through the clutch 92 only when rotated in the clockwise direction relative to the transmission shaft 86, the sprocket wheel 91 and the first transmission shaft 86 do not interfere with each other in the film rewinding mode.

The paper discharge roller 74 is rotated in the counter-clockwise direction in either the printing mode or the film rewinding mode, and thus the developing paper sheet 7 fed out from between the press rollers 11 and 12 is sure to be fed to the paper discharge tray 21 even if the film rewinding operation begins immediately after the end of the printing operation.

The driving system of the take-up spool 10 will be described next.

Figure 4:
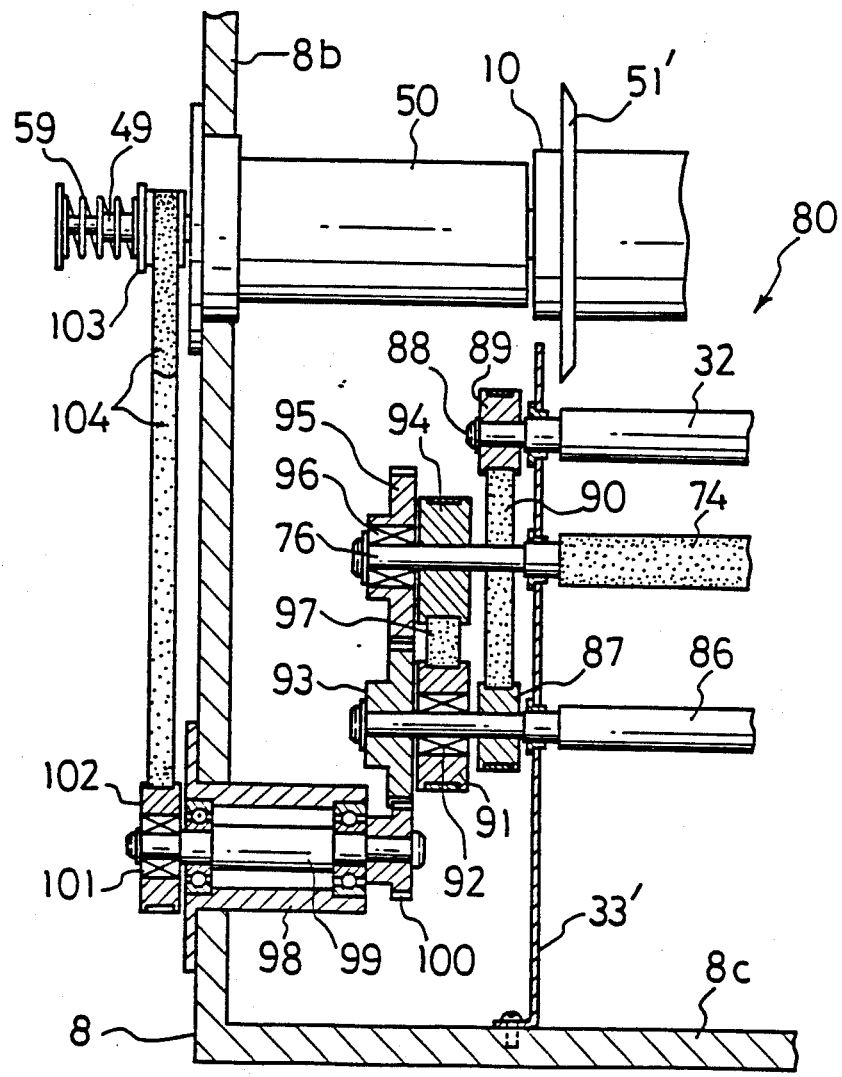
FIG. 4 is a cross-sectional and developed view of a printing and paper discharging system taken along the line IV—IV in FIG. 1.

Referring particularly to FIGS. 4 and 5, it will be seen that a bearing housing 98 is supported by the back wall 8b of the case 8 at its left lower end portion. A second transmission shaft 99 is rotatably supported in the bearing housing 98. A forward end portion of the second transmission shaft 99 has a third gear 100 secured thereto and meshed with the first transmission gear 93. A rear end portion of the second transmission shaft 99 is coupled through a one-way clutch 101 to a sprocket wheel 102.

The one-way clutch 101 is constructed to coupled the second transmission shaft 99 to the sprocket wheel 102 only when the second transmission shaft 99 tends to rotate clockwise relatively to the sprocket wheel 102.

A sprocket wheel 103 is fixed to the rear end portion of the spool shaft 49 of the take-up spool 10 that projects from the outer case 8. An endless timing belt 104 is extended around the sprocket wheel 103 and the sprocket wheel 102 provided on the second transmission shaft 99.

Thus, since the first transmission gear 93 is rotated counter-clockwise in the printing mode, as described previously, the third transmission gear 100 engaged therewith and the second transmission shaft 99 are then rotated clockwise as viewed in FIG. 5. When the second transmission gear 99 is rotated in this direction, the sprocket wheel 102 is also rotated clockwise through the one-way clutch 101.

Thus, since the endless timing belt 104 is driven in the arrow-indicated direction shown in FIG. 5, the take-up spook 10 is rotated in the clockwise direction shown in FIG. 1, or in the film winding direction.

In the film rewinding mode, the first transmission gear 93 is rotated in the clockwise direction, causing the third transmission gear 100 and the second transmission shaft 99 to be rotated in the counter-clockwise direction. When the second transmission shaft 99 is rotated in the counter-clockwise direction, the one-way clutch 101 does not couple the second transmission shaft 99 to the sprocket wheel 102 so that the sprocket wheel 102 is not rotatably driven by the second transmission shaft 99.

As the photosensitive film 4 is withdrawn or unwound from the take-up spool 10, the take-up spool 10, the spool shaft 49 and the sprocket wheel 103 are rotated together in the counter-clockwise direction, and this rotation is transmitted through the endless timing belt 104 to the sprocket wheel 102 on the second transmission shaft 99 so that the sprocket wheel 102 is rotated in the counter-clockwise direction. Since the shaft 99 is being rotated also in the counter-clockwise direction the clutch 101 does not engage.

As shown in FIGS. 1, 2, 6 and 7, a drive section 105 for driving the paper supply and film rewinding system is effective to rotate the paper supply roller 19 and the rewinding roller 22.

Figure 7:
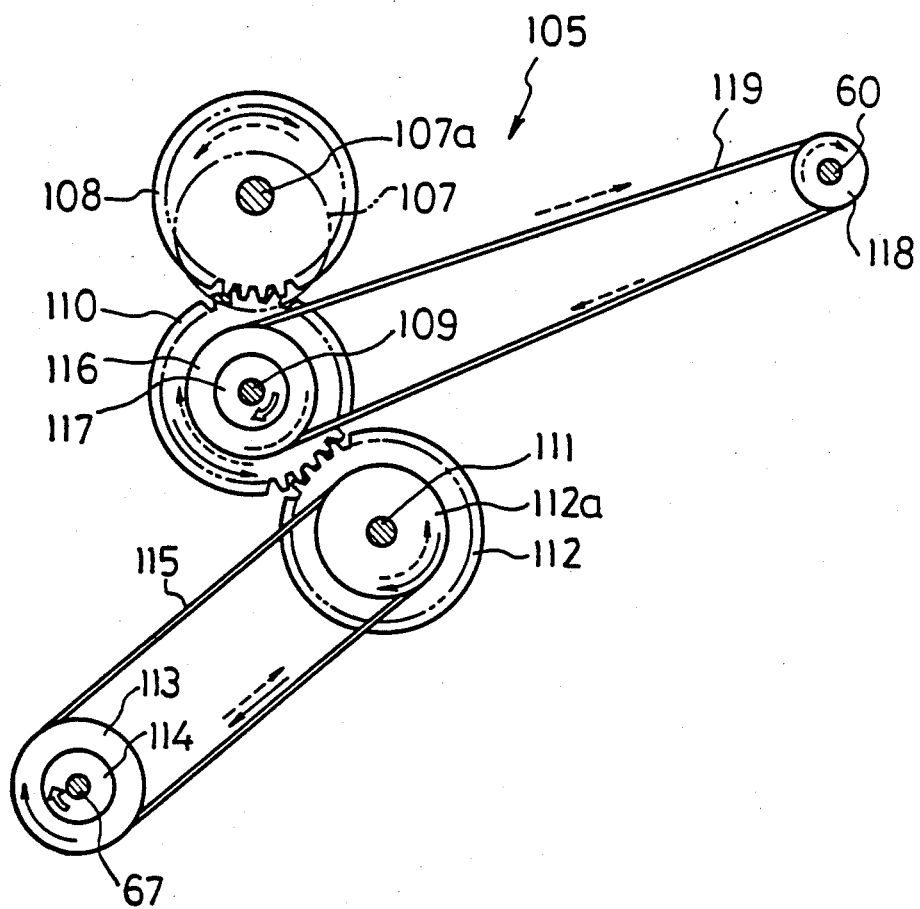
FIG. 7 is a schematic, enlarged view of a driving mechanism included in the paper supply and film rewinding system.

In FIG. 7, the sold arrows show the rotation direction and the travel direction during the supplying of developing paper sheets 7 and the broken arrows indicate the rotation and travel directions for the rewinding of film on the supply spool 6.

There is provided gear supporting chassis 106 of substantially U-shaped configuration, as viewed from above, and which is secured to the back of the support chassis 36', as shown in FIG. 2.

Figure 6:
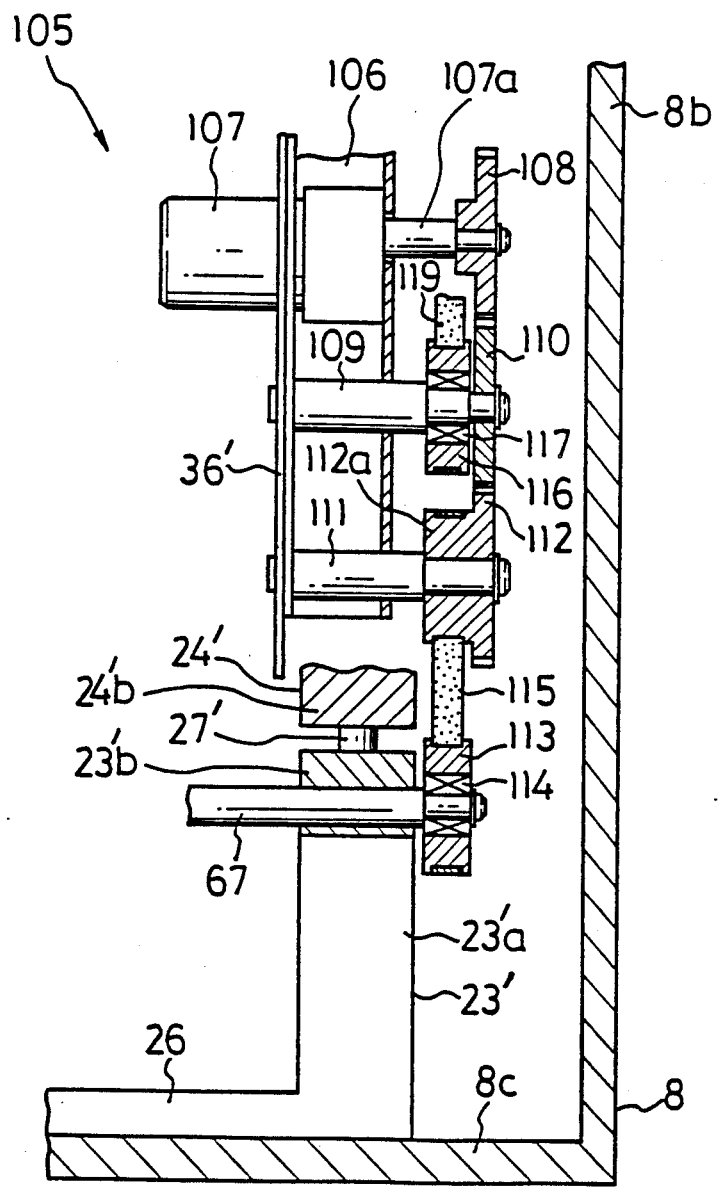
FIG. 6 is a cross-sectional and developed view of the driving portion for the paper supply and film rewinding system, taken along the line VI—VI in FIG. 1.

As shown in FIG. 6, a motor 107 is provided to drive the paper supply roller 19 and the rewinding roller 22 and is hereinafter referred to as the "paper supply motor". The paper supply motor 107 is fixed to the gear support chassis 106, and a gear 108 is fixed to a portion of its rotation shaft 107a that projects rearwardly from the gear support chassis 106.

This paper supply motor 107 is reversible and is rotated in the clockwise direction, as viewed in FIGS. 1 and 7, in the paper supply mode, and in the counter-clockwise direction in the film rewinding mode.

A transmission shaft 109 is rotatably supported by the gear support chassis 106. A first transmission gear 110 is fixed to the rear end portion of the transmission shaft 109. A gear support shaft 111 is fixed to the gear support chassis 106 so as to project rearwardly therefrom. A second transmission gear 112 meshed with the first transmission gear 110 is rotatably supported by the gear support shaft 111. A sprocket wheel 112a is provided integral with the second transmission gear 112.

A sprocket wheel 113 is coupled through a one-way clutch 114 to the back end of the shaft 67 of the paper supply roller 19. An endless timing belt 115 is extended around the sprocket wheel 113 and the sprocket wheel 112a of the second transmission gear 112.

The one-way clutch 114 is constructed to couple the shaft 67 to the sprocket wheel 113 only when the sprocket wheel 113 tends to rotate clockwise relative to the shaft 67 of the paper supply roller 19.

Thus, since the paper supply motor 107 is rotated clockwise in the paper supply mode, as described above, the transmission shaft 109 and the transmission gear 110 are rotated counter-clockwise, and the second transmission gear 112 and its sprocket wheel 112a are rotated clockwise with the result that the endless timing belt 115 is moved in the solid-arrow direction shown in FIG. 7.

Thus, the sprocket wheel 113 is rotated in the clockwise direction, and, by reason thereof, the sprocket wheel 113 is coupled through the one-way clutch 114 to the shaft 67 of the paper supply roller 19 for causing the paper supply roller 19 to rotate clockwise and thereby feed or supply a sheet 7 from the stock in the tray 18.

Since the paper supply motor 107 is rotated counter-clockwise in the film rewinding mode, the first transmission gear 110 is rotated clockwise, and the second transmission gear 112 and its sprocket wheel 112a are rotated counter-clockwise so that the endless timing belt 115 is moved in the broken-arrow direction shown in FIG. 7, causing the sprocket wheel 113 to rotate counter-clockwise. When the sprocket wheel 113 is rotated in this direction, the one-way clutch 114 runs idle with no rotation transmitted to the shaft 67 of the paper supply roller As FIG. 6 shows, there is a sprocket wheel 116 which is located in front of the first transmission gear 110 and coupled through a one-way clutch 117 to the transmission shaft 109. A sprocket wheel 118 (FIGS. 2 and 7) is fixed to the back end of the shaft 60 of the rewinding roller 22. An endless timing belt 119 is extended around the sprocket wheel 118 and the sprocket wheel 116.

The one-way clutch 117 is constructed to couple the transmission shaft 109 to the sprocket wheel 116 only when the transmission shaft 109 is rotated in the clockwise direction, as viewed in FIG. 7, relative to the sprocket wheel 116.

Thus, in the paper supply mode, since the transmission shaft 109 is rotated counter-clockwise as mentioned above, the one-way clutch 117 runs idle with no rotation of the transmission shaft 109 being transmitted to the sprocket wheel 116. Accordingly, the rewinding roller 22 is not rotated by the paper supply motor 107.

As the photosensitive film 4 is withdrawn from the supply spool 6 of the film cassette 2, as previously described, the supply spook 6 is rotated clockwise, causing the rewinding roller 22 to rotate counter-clockwise. This rotation is transmitted through the timing belt 119 to the sprocket wheel 116, so that the sprocket wheel 116 is also rotated counter-clockwise. Since the sprocket wheel 118 on the shaft 60 of the rewinding roller 22 is much smaller in diameter than the sprocket wheel 116, the rotation of the rewinding roller 22 is decelerated in being transmitted to the sprocket wheel 116. As a result, even though the sprocket wheel 116 is rotated counter-clockwise in response to turning of the rewinding roller 22 by withdrawal of the film 4 from the supply spool 6, this rotation of the sprocket wheel 116 is in the clockwise direction relative to the transmission shaft 109 which is rotating counter-clockwise at high speed so that the one-way clutch 117 still runs idle.

In the film rewinding mode, since the transmission shaft 109 is rotated clockwise as mentioned above, the transmission shaft 109 is coupled through the one-way clutch 117 to the sprocket wheel 116. Thus, the sprocket wheel 116 is rotated clockwise, driving the endless timing belt 119 to move in the broken arrow direction shown in FIG. 7 with the result that the rewinding roller 22 is rotated clockwise. Therefore, the supply spool 6 is rotated counter-clockwise, or in the direction to take up or rewind the photosensitive film 4 thereon.

The printer 1 constructed as described above operates to expose the photosensitive film 4 to light, supply the developing paper sheet 7, print an image on the developing paper sheet 7, discharge the printed sheet 7 and rewind the photosensitive film 4 as will be described in detail below.

When a printing operation start command is issued following the loading of the photosensitive film 4 as described above, the photosensitive film 4 is fed forward intermittently by constant incremental movements by the film feed rollers 14 and 15 and the sensitive surface of the film 4 is exposed to light line by line by the FOT 17 to form a photographed film frame of one picture.

Substantially just as, or immediately after the exposure has been completed, the film sensor 58 detects that the leading end of the photographed film frame of the photosensitive film 4 has arrived at the position near the entry side of the nip between the press rollers 11 and 12. Then, the paper supply motor 107 is rotated clockwise, as viewed on FIGS. 1 and 7, causing the paper supply roller 19 to rotate clockwise and thereby feed the uppermost developing paper sheet 7 from the tray 18 and between the guides 70, 70' to the entry side of the nip between the press rollers 11 and 12.

When the developing paper sheet 7 arrives of the entry side of the nip between the press rollers 11, 12, the paper supply motor 107 stops rotating and the printing motor 81 is rotated counter-clockwise, as viewed on FIG. 1 and 5 causing the press roller 11 to rotate counter-clockwise, the travel assisting roller 32 to rotate counter-clockwise, the paper discharge roller 74 to rotate counter-clockwise and the take-up spool 10 to rotate clockwise.

Accordingly, the developing paper sheet 7 and the photosensitive film 4 are fed together in the forward direction, that is, toward the left as viewed on FIG. 1, and pressed against each other between the press rollers 11 and 12 while the developing paper sheet 7 is overlapped with the exposed sensitive surface of the photographed film frame of the photosensitive film 4 and is in face-to-face contact therewith. During this process the non-exposed photosensitive microcapsules constituting the sensitive surface of the photographed film frame of the photosensitive film 4, that is, the microcapsules not yet exposed to light by the FOT 17, are destroyed or crushed by the pressure to release their coloring precursor substance, which is transferred to the developing paper sheet 7 so that the predetermined picture is printed on the developing paper sheet 7. As the leading end of the sheet 7 exits from between the press rollers 11 and 12, the blade 57 is in the position shown in full lines on FIG. 1 and acts to strip or separate the printed sheet 7 from the film 4 and to guide the printed sheet 7 over the paper discharge guide plate 71.

When the printed developing paper sheet 7 has completed come out from between the press rollers 11 and 12 and its trailing end has passed over the printing completion sensor 79, the printing completion sensor 79 generates the predetermined signal.

At this time, the leading end of the still non-exposed portion of the photosensitive film 4 comes near to the nip between the press rollers 11 and 12.

When the printing completion sensor 79 generates the signal, the printing motor 81 is rotated in the reverse or clockwise direction and the paper supply motor 107 is rotated in the counter-clockwise direction.

Thus, the press roller 11 and the travel assisting roller 32 are both rotated in the clockwise or reverse direction while the paper discharge roller 74 is still rotated in the forward or counter-clockwise direction, and the rewinding roller 22 is rotated in the clockwise direction.

Therefore, the photosensitive film 4 is moved in the reverse direction, or withdrawn from the take-up spool 10 and transported in the direction toward the supply spool 6 which is rotated in the film re-winding direction to take-up part of the film 4 which had been previously withdrawn from the cassette case 3.

The take-up spool 10 is rotated in the counter-clockwise direction by the fact that the photosensitive film 4 wound thereon is being withdrawn therefrom, in which case the torque limiter 59 resists such rotation of the spool 10 and thereby provides an appropriate back tension in the film.

When the rewinding roller 22 is rotated a predetermined number of times, a corresponding signal is generated by a revolution sensor or counter, not shown, which is associated with the shaft 60 of the rewinding roller 22, and such signal causes the paper supply motor 107 and the printing motor 81 to stop rotating.

At such time, the photosensitive film 4 previously withdrawn out of the cassette case 3 has been rewound on the supply spool 6 by a predetermined amount, so that the leading end of the non-exposed portion of the film 4 is returned to the position opposite to the light emitting surface 17a of the FOT 17. Thus, the exposure of the film to the next light image commences at a position near the trailing end of the previous photographed film frame or of the preceding exposed portion.

While the photosensitive film 4 is being rewound in this way, the earlier printed developing paper sheet 7 is being fed to the paper discharge tray 21 by the paper discharge belt 20.

As described above, the present invention provides a printer for printing a desired image on a sheet of developing paper in which a sensitive surface of a long photosensitive film comprised of coloring precursors contained in photosensitive microcapsules is exposed to a light image according to a predetermined picture signal to form a photographed film frame, and the exposed surface of the photosensitive film is overlapped with a sheet of developing paper and pressed thereagainst: this printer comprising a supply spool on which the photosensitive film is wound and a take-up spool on which the photosensitive film withdrawn out of the supply spool is wound; film rewinding means for rotating the supply spool in the film winding direction; exposing means for exposing the photosensitive film to light; developing paper supplying means for supplying a developing paper sheet; press rollers for overlapping the photosensitive film with the supplied developing paper sheet and pressing together the overlapped film and paper sheet when being passed together between the rollers; and roller drive means for driving the press rollers to rotate so that, after the printing of the developing paper sheet, the film rewinding means is driven to rewind the photosensitive film until the leading end of the yet non-exposed portion of the photosensitive film is returned to a position opposite to the exposing means.

Thus, according to the present invention, since the exposure of the sensitive surface of the photosensitive film is always started from just in back of the previously exposed portion, the photosensitive film can be effectively used with no waste.

In the above-described embodiment, since the driving system for the developing paper supply means is operated in association with the rotating members of the film winding means and is constructed to also serve as the driving system for the film winding means by providing suitably positioned one-way clutches therein, there is no need to provide a special driving system in the film rewinding means, thereby resulting in a relatively simple construction of the printer.

Nevertheless, a printer according to an embodiment of the invention may employ a special driving system exclusively for the film rewinding means.

Although, in the herein described embodiment, the printing operation on the developing paper is only started after an exposure of the photosensitive film to light for a complete picture has been effected, the printing operation may be started after the exposure of the photosensitive film to light has been performed to a certain extent, that is, has been effected for a part of one full picture. In such case, the printing operation proceeds while the photosensitive film is being exposed for the remaining part of the picture, and then the photosensitive film is rewound after the printing operation is completed for one full picture.

Moreover, although the photosensitive microcapsules of the exposed photosensitive film are partially destroyed or crushed by pressure and the sensitive surface is provided with a mixture of photosensitive microcapsules corresponding to a plurality of different colors and which are exposed to the different, corresponding light rays, the photographed film to be used in accordance with this invention may have other photosensitive characteristics. Further, although the coloring precursor substances which act on the developing paper provide the so-called full color effect, such precursors may have other photosensitive characteristics as long as the precursor substances, when released, act on the developing paper, for either coloring or not coloring the same. Also, the coloring of the substances on the developing paper may provide either a full color or a so-called monotone effect.

This invention can also be applied to a full color printer in which the printing operation is repeated with a plurality of photosensitive films which have respectively provided thereon a plurality of different kinds of coloring precursor substances for respective different colors, thereby producing a print of a full-color picture.

Although a single preferred embodiment of the present invention has been described in detail herein with reference to the accompanying drawings, it will be apparent that many modifications and variations thereof could be effected by one with ordinary skill in the art without departing from the spirit and novel concepts of the invention as defined by the appended claim.

We claim as our invention:

1. An apparatus for printing an image on a sheet of developing paper from a relatively long film having a photosensitive surface composed of photosensitive microcapsules by exposing the photosensitive surface to a light image according to a corresponding picture signal to form a photographed film frame on a respective area of said sensitive surface, overlapping the exposed area of said sensitive surface and a sheet of the developing paper, and pressing together the overlapping areas of said sensitive surface of the film and said sheet of developing paper, the apparatus comprising:

a supply spool on which the film is wound;

a take-up spool on which the film withdrawn from said supply spool is wound;

press rollers urged toward each other and defining a nip therebetween through which said film passes intermediate said supply and take-up spools;

exposing means for selectively exposing to light the photosensitive surface of said film at a position intermediate said supply spool and said nip of the press rollers;

developing paper supplying means including a supply tray for holding a stack of sheets of said developing paper, and paper supply roller means operative to deliver said sheets one at a time from said stack to said nip between said press rollers for passage therebetween with each delivered sheet facing said sensitive surface of the film and being overlapped with a respective exposed area thereof so as to be pressed together therewith in said passage between said press rollers;

means for separating each said sheet of developing paper from said film after passage therewith between said press rollers; and roller drive means having a printing mode and a rewinding mode and including a first reversible motor operative in first and second directions in said printing and rewinding modes, respectively, first transmission means driven by said first motor and including first one-way clutch means through which said first motor drives said paper supply roller means only when said first motor operates in said first direction in said printing mode, second transmission means driven by said first motor and including second one-way clutch means through which said supply spool is rotated in a direction to rewind said film thereon only when said first motor operates in said second direction in said rewinding mode, and a second reversible motor operative in first and second directions for driving said press rollers in corresponding first and second directions in said printing and rewinding modes, respectively.

2. An apparatus according to claim 1, in which said means for separating each said sheet of developing paper from said film includes means defining a path for said film extending from said nip between the press rollers to said take-up spool and means defining a path for each said sheet of developing paper which diverges from said path for the film; and further comprising travel assisting roller means engageable with said film in said path extending from said nip to said take-up spool; paper discharge roller means engageable with each said sheet of developing paper in said path which diverges; and third transmission means driven by said second reversible motor for rotating said travel assisting roller means in directions toward and away from said take-up spool in said printing and rewinding modes, respectively, said third transmission means including third one-way clutch means through which said take-up spool is turned to wind said film thereon only when said second motor is operated in said first direction for said printing mode, and fourth and fifth one-way clutch means through which said paper discharge roller means are driven only in a direction to move each said sheet of developing paper away from said nip in response to operation of said second reversible motor in said first and second directions, respectively.

3. An apparatus according to claim 2, in which said third transmission means further includes a first intermediate shaft, means continuously coupling said second motor to said first intermediate shaft, means having said third one-way clutch means interposed therein for coupling said first intermediate shaft to said take-up spool, a second intermediate shaft connected with said paper discharge roller means, means having said fourth one way clutch means interposed therein for driving said second intermediate shaft from said first intermediate shaft in a direction opposed to the latter in said printing mode, and means having said fifth one-way clutch means interposed therein for driving said second intermediate shaft from said first intermediate shaft and in the same direction as the latter in said rewinding mode.

4. An apparatus according to claim 1, in which said exposing means includes fiber optic means.

5. An apparatus according to claim 1, in which said roller drive means further includes film feed rollers engaging said film in advance of said exposing means, stepping motor means intermittently driving said film feed rollers in an exposing mode of the apparatus, and means responsive to slack in said film between said film feed rollers and said press rollers for controlling the driving of the latter by said second reversible motor in said exposing mode.

6. An apparatus for printing an image on a sheet of developing paper from a relatively long film having a photosensitive surface composed of photosensitive microcapsules by exposing the photosensitive surface to a light image according to a corresponding picture signal to form a photographed film frame on a respective area of said sensitive surface, overlapping the exposed area of said sensitive surface and a sheet of the developing paper, and pressing together the overlapping areas of said sensitive surface of the film and said sheet of developing paper, the apparatus comprising:

a supply spool on which the film is wound;

a take-up spool on which the film withdrawn from said supply spool is wound;

press rollers urged toward each other and defining a nip therebetween through which said film passes intermediate said supply and take-up spools;

exposing means for selectively exposing to light the photosensitive surface of said film at a position intermediate said supply spool and said nip of the press rollers;

developing paper supplying means including a supply tray for holding a stack of sheets of said developing paper, and paper supply roller means operative to deliver said sheets one at a time from said stack to said nip between said press rollers for passage therebetween with each delivered sheet facing said sensitive surface of the film and being overlapped with a respective exposed area thereof so as to be pressed together therewith in said passage between said press rollers;

means for separating each said sheet of developing paper from said film after passage therewith between said press rollers including means defining a path for said film extending from said nip between the press rollers to said take-up spool and means defining a path for each said sheet of developing paper which diverges from said path for the film;

travel assisting roller means engageable with said film in said path extending from said nip to said take-up spool;

paper discharge roller means engageable with each said sheet of developing paper in said path which diverges;

roller drive means having a printing mode and a rewinding mode and including a first reversible motor operative in first and second directions in said printing and rewinding modes, respectively, transmission means driven by said first motor for driving said paper supply roller means only when said first motor operates in said first direction in said printing mode and for driving said supply spool in a direction to rewind said film thereon only when said first motor operates in said second direction in said rewinding mode, and a second reversible motor operative in first and second directions for driving said press rollers in corresponding first and second directions in said printing and rewinding modes, respectively; and additional transmission means driven by said second reversible motor for rotating said travel assisting roller means in directions toward and away from said take-up spool in said printing and rewinding modes, respectively, said additional transmission means including first one-way clutch means through which said take-up spool is turned to wind said film thereon only when said second motor is operated in said first direction for said printing mode, and second and third one-way clutch means through which said paper discharge roller means are driven only in a direction to move each said sheet of developing paper away from said nip in response to operation of said second reversible motor in said first and second directions, respectively.

7. An apparatus according to claim 6, in which said additional transmission means further includes a first intermediate shaft, means continuously coupling said second motor to said first intermediate shaft, means having said first one-way clutch means interposed therein for coupling said first intermediate shaft to said take-up spool, a second intermediate shaft connected with said paper discharge roller means, means having said second one-way clutch means interposed therein for driving said second intermediate shaft from said first intermediate shaft in a direction opposed to the direction of rotation of the latter in said printing mode, and means having said third one-way clutch means interposed therein for driving said second intermediate shaft from said first intermediate shaft and in the same direction as the direction of rotation of the latter in said rewinding mode.

* * * * *